(12) United States Patent
Benwadih

(10) Patent No.: US 11,019,729 B2
(45) Date of Patent: May 25, 2021

(54) DEVICE HAVING A SUBSTRATE CONFIGURED TO BE THERMOFORMED COUPLED TO AN ELECTRICALLY CONDUCTIVE MEMBER

(71) Applicant: Commissariat a l'energie atomique et aux energies alternatives, Paris (FR)

(72) Inventor: Mohammed Benwadih, Champagny sur Marne (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 15/869,169

(22) Filed: Jan. 12, 2018

(65) Prior Publication Data
US 2018/0206341 A1  Jul. 19, 2018

(30) Foreign Application Priority Data
Jan. 12, 2017 (FR) ..................... 17 50269

(51) Int. Cl.
*H05K 3/10*  (2006.01)
*H05K 1/09*  (2006.01)
(Continued)

(52) U.S. Cl.
CPC ............... *H05K 3/10* (2013.01); *B29C 51/10* (2013.01); *B29C 51/14* (2013.01); *B29C 51/421* (2013.01);
(Continued)

(58) Field of Classification Search
CPC ........ H05K 3/10; H05K 1/092; H05K 3/0014; H05K 2203/1121; H05K 2201/09218;
(Continued)

(56) References Cited

U.S. PATENT DOCUMENTS 5,659,153 A * 8/1997 Narayan .............. H05K 1/0284
174/250
6,986,877 B2 * 1/2006 Takikawa ............... B82Y 30/00
423/447.3
(Continued)

FOREIGN PATENT DOCUMENTS

EP  2 114 114 A1  11/2009
JP  2008-998425 A  8/2008
(Continued)

OTHER PUBLICATIONS

French Preliminary Search Report dated Sep. 29, 2017 in French Application 17 50269 filed on Jan. 12, 2017 (with English Translation of Categories of Cited Documents and Written Opinion).
(Continued)

*Primary Examiner* — Jeffrey M Wollschlager
(74) *Attorney, Agent, or Firm* — Oblon, McClelland, Maier & Neustadt, L.L.P.

(57) ABSTRACT

The device intended to be thermoformed comprises a substrate capable of being thermoformed and an electrically conductive member integral with the said substrate. The electrically conductive member comprises: electrically conductive particles, an electrically conductive material, electrically conductive elements of elongated shape. The electrically conductive material has a melting point which is strictly less than the melting point of the electrically conductive particles and than the melting point of the elements of elongated shape.

14 Claims, 4 Drawing Sheets

(51) Int. Cl.
| | |
|---|---|
| *H05K 3/00* | (2006.01) |
| *B29C 51/10* | (2006.01) |
| *B29C 51/14* | (2006.01) |
| *B29C 51/42* | (2006.01) |
| *H05K 3/12* | (2006.01) |
| *B29K 105/00* | (2006.01) |
| *B29L 9/00* | (2006.01) |
| *B29L 31/34* | (2006.01) |
| *H01Q 1/38* | (2006.01) |

(52) U.S. Cl.
CPC .......... *H05K 1/092* (2013.01); *H05K 3/0014* (2013.01); *B29K 2105/256* (2013.01); *B29K 2995/0005* (2013.01); *B29L 2009/005* (2013.01); *B29L 2031/3456* (2013.01); *H01Q 1/38* (2013.01); *H05K 3/1283* (2013.01); *H05K 2201/0129* (2013.01); *H05K 2201/026* (2013.01); *H05K 2201/0272* (2013.01); *H05K 2201/09218* (2013.01); *H05K 2201/10098* (2013.01); *H05K 2203/0425* (2013.01); *H05K 2203/1105* (2013.01); *H05K 2203/1121* (2013.01)

(58) Field of Classification Search
CPC .......... H05K 2201/026; H05K 3/1283; H05K 2201/10098; H05K 2201/0129; H05K 2201/0272; H05K 2203/0425; H05K 2203/1105; B29C 51/421; B29C 51/10; B29C 51/14; B29L 2009/005; B29L 2031/3456; B29K 2995/0005; B29K 2105/256; H01Q 1/38

See application file for complete search history.

(56) References Cited

U.S. PATENT DOCUMENTS

| | | | | |
|---|---|---|---|---|
| 8,178,203 | B2* | 5/2012 | Hata | B82Y 30/00 428/408 |
| 9,305,711 | B2* | 4/2016 | Fujita | H01G 11/36 |
| 9,425,501 | B2* | 8/2016 | Desclos | H01P 11/003 |
| 9,528,667 | B1* | 12/2016 | Pereyra | F21K 9/90 |
| 10,038,113 | B1* | 7/2018 | Nelson | H01L 31/0465 |
| 10,189,971 | B2* | 1/2019 | Lima | B32B 17/10889 |
| 10,350,837 | B2* | 7/2019 | Wardle | C01B 32/162 |
| 2004/0155029 | A1* | 8/2004 | Haag | B29C 45/14811 219/543 |
| 2005/0191520 | A1* | 9/2005 | Guntermann | C08G 61/126 428/690 |
| 2007/0221404 | A1 | 9/2007 | Das et al. | |
| 2008/0086876 | A1* | 4/2008 | Douglas | B82Y 10/00 29/846 |
| 2008/0251768 | A1* | 10/2008 | Hsu | C08L 79/04 252/500 |
| 2009/0186169 | A1* | 7/2009 | Shacklette | H01H 13/704 428/1.6 |
| 2009/0229108 | A1* | 9/2009 | Shamblin | H01Q 1/243 29/600 |
| 2009/0274834 | A1 | 11/2009 | Chopra et al. | |
| 2009/0294739 | A1* | 12/2009 | Lee | B82Y 10/00 252/513 |
| 2010/0000441 | A1* | 1/2010 | Jang | C09D 11/037 106/31.13 |
| 2011/0042813 | A1* | 2/2011 | Crain | C09D 7/70 257/746 |
| 2011/0215279 | A1 | 9/2011 | Zinn | |
| 2012/0017437 | A1 | 1/2012 | Das et al. | |
| 2012/0199393 | A1 | 8/2012 | Yoshikawa et al. | |
| 2012/0235879 | A1* | 9/2012 | Eder | H01Q 1/243 343/873 |
| 2012/0251736 | A1* | 10/2012 | Hong | C09D 11/52 427/559 |
| 2012/0286218 | A1 | 11/2012 | Mei et al. | |
| 2013/0033827 | A1 | 2/2013 | Das et al. | |
| 2014/0004371 | A1* | 1/2014 | Chung | H01B 1/02 428/549 |
| 2014/0151607 | A1* | 6/2014 | Lowenthal | C09D 11/101 252/503 |
| 2015/0138024 | A1* | 5/2015 | Kalistaja | H01Q 1/36 343/702 |
| 2015/0257278 | A1* | 9/2015 | Niskala | H05K 3/1216 361/749 |
| 2015/0337145 | A1* | 11/2015 | Torrisi | C09D 11/037 428/207 |
| 2016/0012936 | A1* | 1/2016 | Wu | H05K 1/097 428/195.1 |
| 2016/0086686 | A1* | 3/2016 | Dorfman | H01B 1/20 428/412 |
| 2016/0113118 | A1* | 4/2016 | Pereyra | H05K 1/0274 362/382 |
| 2016/0295702 | A1* | 10/2016 | Heikkinen | H05K 1/0274 |
| 2016/0309595 | A1* | 10/2016 | Heikkinen | B29C 45/1418 |
| 2016/0311705 | A1* | 10/2016 | Cok | C02F 1/46104 |
| 2016/0316570 | A1* | 10/2016 | De Vaan | H05K 1/0284 |
| 2017/0135198 | A1* | 5/2017 | Keranen | H05K 1/0274 |
| 2017/0226303 | A1* | 8/2017 | Feng | B29C 51/10 |
| 2017/0298242 | A1* | 10/2017 | Mostowy-Gallagher | C09D 11/52 |
| 2018/0114703 | A1* | 4/2018 | Karni | H01B 1/22 |
| 2018/0149321 | A1* | 5/2018 | Torvinen | F21K 9/61 |
| 2018/0279471 | A1* | 9/2018 | Chen | B32B 27/08 |
| 2018/0348900 | A1* | 12/2018 | Heinrich | G06F 3/041 |

FOREIGN PATENT DOCUMENTS

| | | |
|---|---|---|
| WO | 2010/123733 | 10/2010 |
| WO | 2016/060838 | 4/2016 |

OTHER PUBLICATIONS

Zhigang Wu, et al., "Hemispherical coil electrically small antenna made by stretchable conductors printing and plastic thermoforming," Journal of Micromechanics and Microengineering, 2015 (pp. 1-5).

Kamil Janeczek, et al., "Investigation of RFID tag antennas printed on flexible substrates using two types of conductive pastes," IEEE « Electronic System-Integration Technology Conference (ESTC) », 3rd Conference, Sep. 13-16, 2010, 5 pages.

A. Ciccomancini Scogna, et al., "Performance analysis of stripline surface roughness models," International Symposium on Electromagnetic Compatibility EMC Europe, 2008, 6 Pages.

French Preliminary Search Report dated Feb. 10, 2017 in Patent Application No. FR 1655337 (with English translation of categories of cited documents), 3 pages.

Office Action dated May 16, 2018 in U.S. Appl. No. 15/618,835.

Office Action dated Jan. 11, 2019 in U.S. Appl. No. 15/618,835.

Elena V. Agina, et al., "Polymer Surface Engineering for Efficient Printing of Highly Conductive Metal Nanoparticle Inks" ACS Applied Materials & Interfaces, vol. 7, No. 22, 2015, pp. 11755-11764.

French Preliminary Search Report dated Feb. 21, 2017 in French Application 16 55337 filed on Jun. 10, 2016 (with English Translation of Categories of Cited Documents and Written Opinion), 10 pages.

U.S. Office Action dated Jan. 10, 2020 in U.S. Appl. No. 15/618,835, 10 pages.

U.S. Office Action dated May 31, 2019 in U.S. Appl. No. 15/618,835, 13 pages.

* cited by examiner

DEVICE HAVING A SUBSTRATE CONFIGURED TO BE THERMOFORMED COUPLED TO AN ELECTRICALLY CONDUCTIVE MEMBER

FIELD OF THE INVENTION

The field of the invention relates to thermoformable devices and more particularly to the thermoforming of a device equipped with an electrically conductive member capable of having electrical conduction after thermoforming.

STATE OF THE ART

In the field of electronics, it is known to form electrically conductive tracks which can delimit, at least in part, an antenna or also an inductance. The deposition techniques of microelectronics are appropriate but expensive and limited to rigid supports. There thus exists a need to reduce the costs of the operations for forming electrically conductive tracks and to make possible the formation of such tracks on supports which are, for example, flexible and capable of being thermoformed according to requirements.

From the perspective of reducing the costs, solutions have been developed for printing electrically conductive tracks based on inks. Apart from the advantage of reducing the costs, such inks can also be subjected to stresses after they have been dried which makes possible the deposition on a flexible substrate.

The document "Investigation of RFID tag antennas printed on flexible substrates using two types of conductive pastes" by Kamil Janeczek et al. published in IEEE, "Electronic System-Integration Technology Conference (ESTC)", 2010, 3rd-Conference of 13-16 Sep. 2010, which was held in Berlin, provides for the use of a paste comprising silver mixed with a polymer. The polymer makes possible a degree of flexibility but has the disadvantage of damaging the electrical conductivity and of creating parasitic capacitances. The result of this is the formation of antennas of mediocre quality since the quality factor of an antenna is dependent on its electrical conductivity.

Furthermore, according to the applications, it is possible to envisage incorporating an electrically conductive track, for example forming an antenna, in a place having a very specific shape, such as a mobile telephone casing. For such an incorporation, it is possible to resort to the thermoforming of a substrate on which the track is formed. Depending on the shape related to the thermoforming, this results in an issue of electrical continuity within the track as the latter may have, after thermoforming, breaks or cracks harmful to the conduction of the current. Ink suppliers essentially favour the particles plus polymer route, which in their eyes has the greatest chance of getting through the thermoforming step.

It is thus understood that there exists a need to develop novel solutions which make it possible to improve the electrical continuity within an electrically conductive member, notably after thermoforming of a device comprising a substrate on which the electrically conductive member is formed.

OBJECT OF THE INVENTION

It is an aim of the invention to provide a device intended to be deformed, notably by thermoforming, and comprising an electrically conductive member capable of having a satisfactory electrical conduction even after it has been deformed. The aim is thus to find a solution which makes it possible to respond to the issue of improving the electrical conductivity of the electrical conductive member, in particular when the latter is intended to be thermally and mechanically stressed.

This aim is approached with a device intended to be thermoformed comprising a substrate capable of being thermoformed and an electrically conductive member integral with the said substrate. This device is characterized in that the electrically conductive member comprises electrically conductive particles, an electrically conductive material and electrically conductive elements of elongated shape. Furthermore, the electrically conductive material has a melting point which is strictly less than the melting point of the electrically conductive particles and than the melting point of the elements of elongated shape.

Preferably, the elements of elongated shape have a length greater than or equal to 20 μm.

Preferably, at least one of the elements of elongated shape adopts a folded-back configuration.

According to an embodiment, the electrically conductive member comprises at least one bonding element comprising at least a portion of the electrically conductive material, which portion is obtained by melting and then solidifying the electrically conductive material, each bonding element connecting at least one of the electrically conductive particles to at least one of the elements of elongated shape.

According to an implementation, the electrically conductive member comprises a stack of layers comprising a first layer and a second layer arranged on the first layer, the first layer being interposed between the substrate and the second layer. The first layer comprises a part of the elements of elongated shape. The second layer comprises another part of the elements of elongated shape, the electrically conductive particles and the electrically conductive material.

Alternatively, the electrically conductive member can comprise a stack of layers comprising a first layer and a second layer arranged on the first layer. The first layer is interposed between the substrate and the second layer. The first layer comprises the elements of elongated shape. The second layer comprises the electrically conductive particles and the electrically conductive material.

According to another implementation, the electrically conductive member comprises a stack of layers comprising a layer comprising the electrically conductive particles, a layer comprising the electrically conductive material and a layer comprising the elements of elongated shape.

According to yet another implementation, the electrically conductive member comprises first parts each comprising a corresponding part of the electrically conductive particles, and second parts each comprising a corresponding part of the elements of elongated shape. The electrically conductive material is present in the first parts and/or in the second parts. The electrically conductive member comprises a stack of layers comprising a first layer provided with at least one of the first parts and with at least one of the second parts, and a second layer arranged on the first layer. The second layer is provided with at least one of the first parts and with at least one of the second parts, each second part being at a distance from the other second parts.

Advantageously, the substrate has, at its interface with the electrically conductive member, a hollowed structure.

Preferably, the elements of elongated shape are formed by nanowires and/or nanotubes and/or graphene sheets, and/or elements of elongated shape comprising a polymer core covered, in all or part, with an electrically conductive layer.

Preferably, the elements of elongated shape have a length strictly greater than the size of the electrically conductive particles.

The invention also relates to a method for the use of a device intended to be thermoformed as described; this method comprises a thermoforming phase comprising: a step of heating the said device so as to allow a shaping of the substrate of the device, a step of shaping the substrate according to a predetermined shape, during which the said electrically conductive member remains bonded to the said substrate, and a cooling step at the end of which there is formed a thermoformed device comprising the substrate adopting the predetermined shape.

The method can comprise a step of providing an object comprising the predetermined shape, and the shaping step successively comprises: a step of projecting a gaseous fluid, so as to stretch the substrate of the heated device, and a suction step which makes it possible to flatten the device against the object so that the said device takes on the shape of at least a part of the surface of the said object.

The method can comprise a step of additional heating of the device, carried out after the cooling step, to a temperature which makes it possible to melt the electrically conductive material.

Preferably, the heating step causes the change of electrically conductive material from a solid state to a liquid state.

According to an implementation, at the end of the cooling step, the electrically conductive member comprises an assembly of electrically conductive particles and of elements of elongated shape rendered integral by electrically conductive material.

The invention also relates to a thermoformed device comprising a substrate, the shape of which was obtained by thermoforming, and an electrically conductive member integral with the said substrate. The electrically conductive member comprises electrically conductive particles, electrically conductive elements of elongated shape and an electrically conductive material having a melting point which is strictly less than the melting point of the electrically conductive particles and than the melting point of the elements of elongated shape. The electrically conductive member can comprise an assembly of electrically conductive particles and of elements of elongated shape rendered integral by electrically conductive material.

The invention also relates to a method for the manufacture of a device intended to be thermoformed, the manufacturing method comprising a step of providing the substrate and a step of formation of the electrically conductive member implementing at least one step of deposition of an ink on the substrate.

BRIEF DESCRIPTION OF THE FIGURES

A better understanding of the invention will be obtained on reading the description which will follow, given solely by way of non-limiting example and made with reference to the drawings, in which.

In these figures, the same references are used to denote the same elements.

The figures are diagrammatic views.

Furthermore, the elements represented in the figures are not necessarily to scale.

DESCRIPTION OF PARTICULAR EMBODIMENTS

A description is given below of a device intended to be deformed, notably thermoformed, and which makes it possible to ensure, even after the deformation, an electrical continuity within an electrically conductive member, or track, which the device comprises. After thermoforming, reference is made to thermoformed device. For this, the electrically conductive member judiciously comprises electrically conductive particles, an electrically conductive material, in particular intended to undergo melting during the thermoforming or subsequent to the thermoforming, and electrically conductive elements of elongated shape which will make it possible to ensure the electrical continuity between electrically conductive particles which are moving away during the deformation, notably thanks to the melting of the electrically conductive material. In particular, this melting of the electrically conductive material makes it possible, in combination with the elongation of the elements of elongated shape, to connect electrically conductive particles to one another subsequent to a stretching/deformation of a substrate on which the electrically conductive member is formed.

Figure 1:
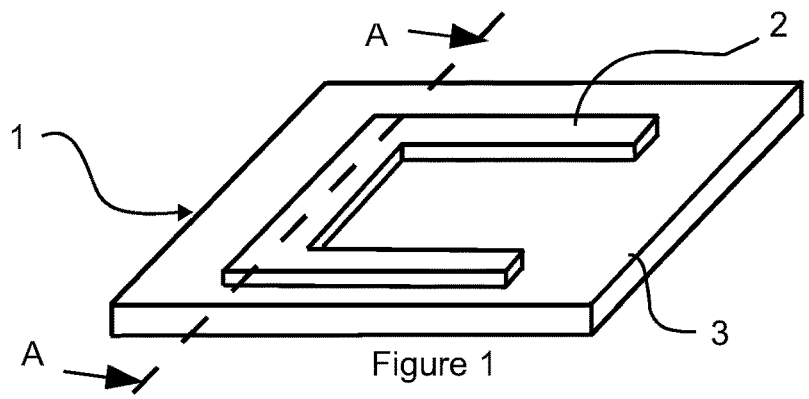
FIG. 1 diagrammatically illustrates in perspective a device intended to be thermoformed.

FIG. 1 diagrammatically illustrates a device 1 intended to be thermoformed. This device 1 comprises an electrically conductive member 2 and a substrate 3 capable of being (that is to say, configured so as to be) thermoformed, the said electrically conductive member 2 being integral with the substrate 3. The term "integral with the substrate" is understood to mean that the electrically conductive member 2 is arranged/formed on the substrate 3, that is to say that it is bonded to the said substrate 3.

The electrically conductive member 2 can be an electrically conductive track. This electrically conductive member 2, and thus if appropriate the track, can be an antenna, or an inductance, in particular obtained by printing on the substrate 3. The antenna can be chosen from: a wire antenna (dipole, monopole, Yagi), a slot antenna (half- or quarter-wave), a patch antenna (planar), an aperture (horn) antenna and a reflector-type (parabolic) antenna. The types of antenna given here are not limiting.

Conventionally, an antenna makes it possible to establish a radio connection from an emitter towards a receiver. In emission, an antenna makes it possible to transform an electrical signal into an electromagnetic wave and, in reception, the reverse case prevails.

As an important parameter for producing an efficient antenna is its electrical conductivity, it is understood that it is important for this electrical conductivity to still be good after thermoforming.

The substrate 3 capable of being thermoformed can be a substrate 3 comprising or consisting of polycarbonate (PC) or a substrate comprising or consisting of polycarbonate/acrylonitrile-butadiene-styrene (PC/ABS) or a substrate comprising or consisting of polyethylene (PE). Other materials can be used to form the substrate 3, as long as they can ensure the desired function, that is to say make possible a softening of all or part of the substrate when it is subjected to a predetermined temperature allowing the shaping thereof and make it possible for the substrate to retain the shaping when the substrate is cooled and becomes hard again. In other words, the term "substrate 3 capable of being thermoformed or thermoformable substrate" is understood to mean, in the present description, a substrate or support which can be thermoformed, that is to say shaped under the effect of heat and notably under mechanical stress. Such a substrate 3 can thus have properties which allow it to be stretched while adopting a specific shape when it is heated. For example, when the substrate 3 is made of polycarbonate, the temperature at which the thermoforming is carried out is generally 150° C. The substrate 3 can have a thickness comprised between 75 µm and 1 mm and notably comprised between 175 µm and 250 µm, for example equal to 175 µm or 250 µm. The lower the thickness of the substrate, the easier the shaping thereof by thermoforming.

Thermoforming is a technique which consists in taking a material in the substrate form, such as, for example, a sheet (in our case, preferably a plastic), in heating it in order to soften it and in taking advantage of this ductility to shape it with an object, such as a mould. The material hardens again when it is cooled, retaining the shape of the mould, which can correspond to the shape of a casing of an electronic device. Thermoforming is based on the phenomenon of glass transition of thermoplastics. The substrate can be made of a thermoplastic material. This is because, having passed their glass transition temperature, thermoplastic materials are in the rubber-type state; it then becomes easy to give them a new shape. Once the temperature has fallen below the glass transition, the thermoplastic material (for example a polymer) returns to the solid (glassy) state and retains its new shape. Thermoforming generally takes place according to the following phases: heating of the material; shaping of the material on the mould (by vacuum or under pressure); cooling (the piece remains on the mould); removing from the mould and discharging the final piece.

According to the present invention, in the case of plastic thermoforming, the substrate 3 used is generally provided in the form of a plastic sheet on which the electrically conducting member 2, for example the antenna, is formed, which member is thermoformed on a plastic casing, generally made of ABS (for Acrylonitrile-Butadiene-Styrene) or PC/ABS.

Thanks to the thermoforming, it is possible to easily incorporate an antenna inside an electronic device (such as, for example, a mobile telephone or other). This is because it is possible here to incorporate an antenna on a substrate capable of being thermoformed in order to have an antenna module which can subsequently be easily incorporated in a casing after thermoforming of the substrate on which the antenna is formed.

As the electrically conductive member 2 is integral with/formed on the substrate 3, during the thermoforming the said member 2 continues to take on the shape of the substrate 3 owing to the fact that it is capable of undergoing stresses without breaking, or as a result of fusible characteristics of at least a part of this electrically conductive member. This ability and these characteristics are related to the composition of the electrically conductive member, which composition is described below. The electrically conductive member can be integral with the substrate 3 before, during and after the thermoforming via Van der Waals forces.

Figure 2:
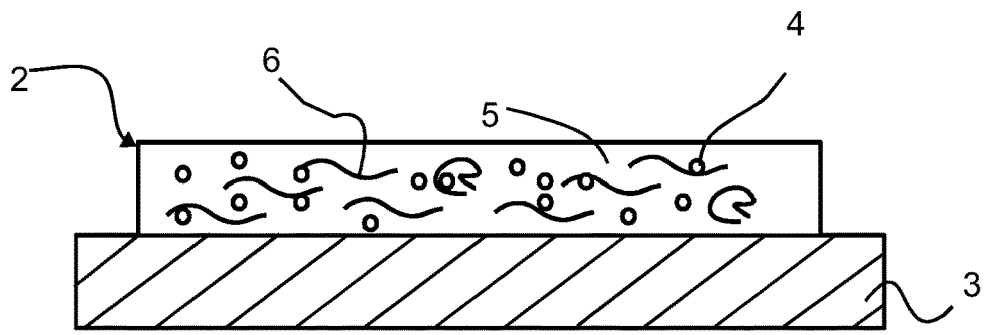
FIG. 2 illustrates a view in section of FIG. 1 along the section A-A.

As illustrated diagrammatically in FIG. 2, the electrically conductive member 2 comprises electrically conductive particles 4 (also known as particles 4 in the continuation of the description), an electrically conductive material 5 and electrically conductive elements of elongated shape 6 (also known simply as elements of elongated shape 6 in the present description). The particles 4, the elements of elongated shape 6 and the electrically conductive material 5 are distinct things. The electrically conductive material 5 presents (that is to say that it has) a melting point which is strictly less than the melting point of the electrically conductive particles 4 and than the melting point of the elements of elongated shape 6. It is also understood from what has been said above that the substrate 3 can be associated with a thermoforming temperature which corresponds to the temperature at which it exists in a softened/ductile form which allows its shape to be modified. In particular, the melting point of the electrically conductive material 5 is less than or equal to the thermoforming temperature of the substrate 3, which advantageously makes it possible to melt the electrically conductive material 5 during the thermoforming. Furthermore, the thermoforming temperature is strictly less than the melting point of the electrically conductive particles 4 and than the melting point of the elements of elongated shape 6. According to an alternative, the heating of the device which makes it possible to shape the substrate in order to thermoform it is carried out in a time which does not make possible the melting or the appropriate melting of the electrically conductive material. According to this alternative, firstly, the shaping of the substrate is carried out and then, after the shaping, an additional heating step is carried out, notably during which the shape of the substrate acquired during the shaping is retained, making it possible to melt the (that is to say, bringing about the melting of the) electrically conductive material for the purpose of improving the electrical conduction of the electrically conductive member by establishment of an electrically conductive connection between electrically conductive particles via electrically conductive material.

In particular, as will be described in detail subsequently, the electrically conductive particles 4 make it possible to confer, on the electrically conductive member, an electrical resistance suited to its use. At least a part of the elements of elongated shape 6 and of the electrically conductive material 5 are configured to connect particles 4 to one another after thermoforming. Notably, the electrically conductive material makes it possible to connect, for example by soldering, electrically conductive particles 4 to elements of elongated shape 6 and elements of elongated shape 6 to one another.

As regards the embodiment of FIG. 2, the electrically conductive member can comprise just one layer comprising a mixture of the electrically conductive particles 4, of the electrically conductive material 5 and of the elements of elongated shape 6 which form a coherent assembly which is electrically conductive and attached to the substrate 3, notably via Van der Waals forces and advantageously thanks to a treatment applied to the substrate 3 which makes it possible to improve the adhesion between the substrate 3 and the electrically conductive member 2. The treatment targeted above can be a plasma or UV (ultraviolet) ozone treatment applied to the substrate. UV ozone makes it possible to release bonds from the substrate, such as OH— and COOH bonds, which make it possible to react, if appropriate with organic entities present in an ink used to form the electrically conductive member, such as, for example, a polymer binder used in the ink, or residues of wastes or of organic precursors not decomposed thermally present in the formulation of the ink. Furthermore, UV ozone creates a small nanometric roughness of the substrate which substantially improves the adhesion of future layer(s) which will be deposited on the substrate in order to form the electrically conductive member. This treatment of the substrate can thus be applied to all the embodiments which will be described below so as to improve the adhesion between the substrate and the electrically conductive member.

The term "melting point of the electrically conductive material" is understood to mean the temperature at which the electrically conductive material changes from a solid state to a liquid state. The term "melting point of the electrically conductive particles 4" is understood to mean the temperature at which the electrically conductive particles 4 can change from a solid state to a liquid state. The term "melting point of the elements of elongated shape" is understood to mean the temperature at which the elements of elongated shape 6 can change from a solid state to a liquid state.

In the present description, the melting points are given at atmospheric pressure. In other words, the melting points in the present description are compared under the same pressure. Furthermore, when the thermoforming temperature is compared with a melting point, they are compared at the same pressure.

Preferably, the device intended to be thermoformed is configured so as to adopt, when it is heated to a predetermined temperature also known as thermoforming temperature, a configuration in which the electrically conductive material 5 is in the liquid state, the electrically conductive particles 4 and the elements of elongated shape 6 are in the solid state and the substrate 3 is in a state allowing it to be shaped: that is to say, a malleable or ductile state. According to an alternative, the predetermined temperature is such that the electrically conductive material 5 is in the liquid state and the electrically conductive particles 4, the elements of elongated shape 6 and the substrate 3 are in the solid state. This alternative is notably implemented by an additional heating step notably carried out subsequent to the thermoforming.

The term "element of elongated shape 6" is understood to mean, in the present description, an element which has a long shape, preferably a length strictly greater than its dimensions measured along a sectional plane orthogonal to its direction of elongation. An element of elongated shape 6 can adopt a deployed configuration in which it is stretched out along its length, for example where it is rectilinear or substantially rectilinear, and a folded-back/bent configuration in which it has curves along its elongation. In the folded-back configuration, the element of elongated shape 6 can be wound over itself. In the context of the device intended to be thermoformed, at least one of the elements of elongated shape 6 can adopt a folded-back configuration, notably several of the, indeed even all of the, elements of elongated shape 6 can adopt the folded-back configuration within the electrically conductive member 2 of the device intended to be thermoformed. This exhibits the advantage of facilitating the electrical connections within the electrically conductive member 2 at the end of the thermoforming as the element of elongated shape 6 will naturally have a tendency to be deployed during the thermoforming as the result of a stretching of the substrate 3 (with or without melting of the electrically conductive material 5) and will make it possible for the element of elongated shape 6 to participate in the electrical linking of particles 4 which may have moved away. Furthermore, during the thermoforming or a stretching of the substrate, the elements of elongated shape will naturally have a tendency to become aligned as a function of the thermoforming or of the stretching, which will subsequently make it possible to improve the reconnections of electrically conductive particles 4.

In this sense, the elongated shape of the elements 6 makes it possible for the latter to absorb the stresses due to the deformation and to participate preferably in the formation of an electrically conductive connection or path between electrically conductive particles 4 which may move away from one another during the thermoforming of the device. In order to improve this function of connection of particles to one another, the elements of elongated shape 6 have a length strictly greater than the size, also known as the maximum dimension, of the electrically conductive particles 4. In other words, each element of elongated shape 6 has a length strictly greater than the size, or maximum dimension, of each of the electrically conductive particles 4.

The elements of elongated shape 6 preferably have a length of greater than or equal to 20 µm. For each element of elongated shape, its length can nonlimitingly be comprised between 20 µm and 100 µm or more generally between 5 µm and 1000 µm; in fact, the length will depend on the type of element of elongated shape, as will be seen subsequently. Preferably, the elements of elongated shape 6 has a length greater than or equal to the stretching of the substrate 3 which will be carried out during the thermoforming, which makes it possible to improve the electrical conductivity of the electrically conductive member 2 after thermoforming by preventing the formation of breakages in electrical conductivity within the electrically conductive member 2. This is because the presence of elements of elongated shape 6 makes it possible, in the event of stretching of the substrate 3, for at least some of the electrically conductive particles 4 to slide along elements of elongated shape 6. These particles 4 are notably connected, after melting of the electrically conductive material 5, to at least one of the elements of elongated shape 6 by electrically conductive material 5 which has undergone melting.

The elements of elongated shape 6 can have lateral dimensions, or a diameter, comprised between 5 nm and 1 µm, preferably comprised between 10 nm and 100 nm. Other dimensions are also envisaged, as will be seen subsequently.

In particular, the elements of elongated shape 6 can be electrically conductive nanowires or nanotubes, notably with a length comprised between 20 µm and 100 µm and with a width comprised between 10 nm and 100 nm. For this, the nanowires can be silver, copper, nickel, gold or even carbon nanowires which are electrically doped.

In the case where the elements of elongated shape are carbon nanotubes, their length can be comprised between 20 µm and 1000 µm and their width comprised between 10 nm and 100 nm.

The elements of elongated shape 6 can also be carbon nanotubes electrically doped to provide the function of electrical conductivity of these elements of elongated shape 6.

The elements of elongated shape can also be provided in the form of elongated graphene sheets (for example a 2D graphene layer). In this instance, an elongated sheet can be a graphene monoatomic layer (with a maximum thickness of 1 nm), the surface area of a main face of which can range from 5 µm×5 µm up to 100 µm×100 µm.

Figure 3:
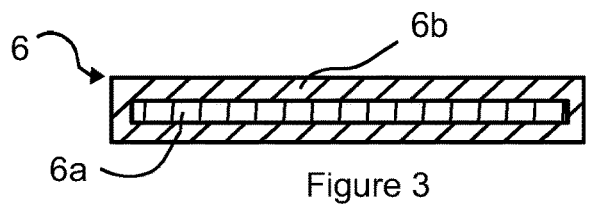
FIG. 3 is an example of an element of elongated shape seen along a longitudinal section of the said element of elongated shape.

According to yet another embodiment (FIG. 3), the elements of elongated shape 6 can comprise a polymer core 6a for example comprising polystyrene (PS) or polybutadiene or polymethyl methacrylate (PMMA) or polydimethylsiloxane (PDMS). This core 6a is covered, in all or part, with an electrically conductive layer 6b conferring, on the elements of elongated shape 6, their electrical conductivity function. The electrically conductive layer 6b can comprise a material chosen from: Ag, Cu, Ni, Au, and a PEDOT:PSS conductive polymer (it is notably a mixture of the polymer PEDOT, also known under the name poly(3,4-ethylenedioxythiophene), and of the polymer PSS, also known under the name sodium poly(styrene sulfonate)). In other words, the layer 6b can form a coating sheath of the core 6a. According to this embodiment, the core 6a can have a thickness comprised between 10 nm and 500 nm, a width along a direction orthogonal to the direction along which the thickness is measured comprised between 1 µm and 50 µm, and a length comprised between 10 µm and 500 µm. Such elements of elongated shape 6 are preferred as they are easier to manufacture and can have greater dimensions, for example in width and in length. Another advantage is that such elements of elongated shape 6 can be elastic, which is a plus in the application as the electrical conductive member can be more easily subjected to strains without being damaged. Furthermore, an element of elongated shape 6 comprising polymer is very easy to manufacture and the dimensions can be very broad, whereas a silver nanowire will be harder to obtain with dimensions of the order of a length of 500 µm. The thickness of the electrically conductive layer covering the core is preferably greater than 25 nm and preferably comprised between 35 nm and 100 nm, in order to provide a satisfactory electrical conduction function.

In particular, within one and the same electrically conductive member 2, the elements of elongated shape 6 can be of the same type or of different types. In other words, each element of elongated shape 6 can be chosen, independently of the other elements of elongated shape, from the different possibilities touched on in the present description. Thus, the elements of elongated shape 6 can, for example, be formed by nanowires and/or nanotubes and/or graphene sheets, and/or elements of elongated shape comprising a polymer core 6a covered, in all or part, with an electrically conductive layer 6b.

Notably, the dimensions of the elements of elongated shape 6 are suitable for making possible deposition of these elements by printing for the purpose of forming the electrically conductive member.

The electrically conductive particles 4 can comprise a metal or can consist of a metal. The metal can be chosen from silver, gold, nickel, copper, platinum and palladium. In this sense, the electrically conductive particles can be metal particles. The electrically conductive particles 4 can all comprise the same metal or different metals. In other words, each electrically conductive particle can comprise one of the following materials chosen, notably independently of the choice for the other particles, from: gold, silver, nickel, copper, palladium and platinum. Preferably, each electrically conductive particle comprises a maximum dimension (or size) of between 10 nm and 10 µm, this making it possible to be compatible with the techniques for printing, for example by inkjet printing, the electrically conductive member. Furthermore, the contact surface between particles of nanometric size is greater when the particles have a size strictly of less than 200 nm as they fits together better and thus the conductivity will be thereby improved. The minimum dimensions of each of the electrically conductive particles can be comprised between 10 nm and 50 nm.

The electrically conductive particles 4 preferably have an electrical conductivity comprised between $10^4$ S/m and $10^8$ S/m and preferably comprised between $10^6$ S/m and $10^7$ S/m. In fact, the role of the electrically conductive particles 4 is to decrease the overall electrical resistivity of the electrically conductive member since theoretically it is they which conduct the best.

The electrically conductive material 5 is a fusible material, that is to say a material capable of melting under the action of heat. The electrically conductive material 5 may have the form of fusible particles dispersed within the electrically conductive member 2 or may have the form of bonding elements which are independent or which belong to the same layer made of electrically conductive material 5 and which electrically bond elements of elongated shape 6 to electrically conductive particles 4. In the present description, when reference is made to bonding elements comprising at least a portion of the electrically conductive material 5, these elements can be connected by a continuity of matter made of electrically conducting material. When the electrically conductive material 5 is provided in the form of fusible particles, that is to say before they are subjected to melting, for example during the thermoforming, the fusible particles can have dimensions comprised between 2.5 µm and 25 µm, notably a radius of 7.5 µm, these dimensions being notably compatible with the printing techniques.

More particularly, the electrically conductive material 5 is intended to connect electrically conductive particles 4 with elements of elongated shape 6 in the context of the thermoformed device. In other words, the electrically conductive material 5 is intended to mechanically and electrically bond, notably after thermoforming the device, a least a part of the electrically conductive particles to corresponding elements of elongated shape 6.

By way of nonlimiting example, the electrically conductive material 5 can be:
- a Darcet's alloy: $Bi_{50}Pb_{25}Sn_{25}$, the melting point of which is 94° C.,
- a Newton's alloy: $Bi_{50}Pb_{31}Sn_{19}$, the melting point of which is 94° C.,
- $Sn_{43}Pb_{43}Bi_{14}$ or $Sn_{42}Bi_{58}$ with eutectics between 138° C. and 163° C.,
- chosen from Bi—Pb binary eutectic alloys having a Bi content comprised between 55% and 58%, the percentage giving in this instance the proportions by weight, and having a melting point of between 124° C. and 125° C.,
- made of indium, the melting point of which is 156° C.,
- an alloy belonging to the family of the Au_Sn eutectics in different proportions, for example 20% of gold and 80% of Sn, with the percentage giving in this instance the proportions by weight, or others as long as the melting point is less than 250° C. in order to be compatible with numerous plastic substrates,
- chosen from alloys comprising silver and bismuth or others of this family,
- chosen from one of the following alloys: Sn—Ag—Cu, Sn—Pb or Sn—Pb—Ag,
- chosen from the family of indium, bismuth, tin, lead.

The melting points given above are notably those under the conditions for carrying out the thermoforming, or alternatively subsequent to the shaping of the substrate or to the thermoforming, and are given at atmospheric pressure.

The examples given above are not limiting; this is because any type of electrically conductive material 5 capable of melting during the thermoforming of the device can be used. More particularly, the electrically conductive material 5 is chosen so as to have a melting point comprised between 90° C. and 210° C. or more particularly between 100° C. and 210° C. at atmospheric pressure.

In the context of the device intended to be thermoformed, the electrical conduction of the electrically conductive member 2 can be carried out by bringing electrically conductive particles 4 into contact with one another and with the electrically conductive material 5 and/or elements of elongated shape 6.

Figure 4:
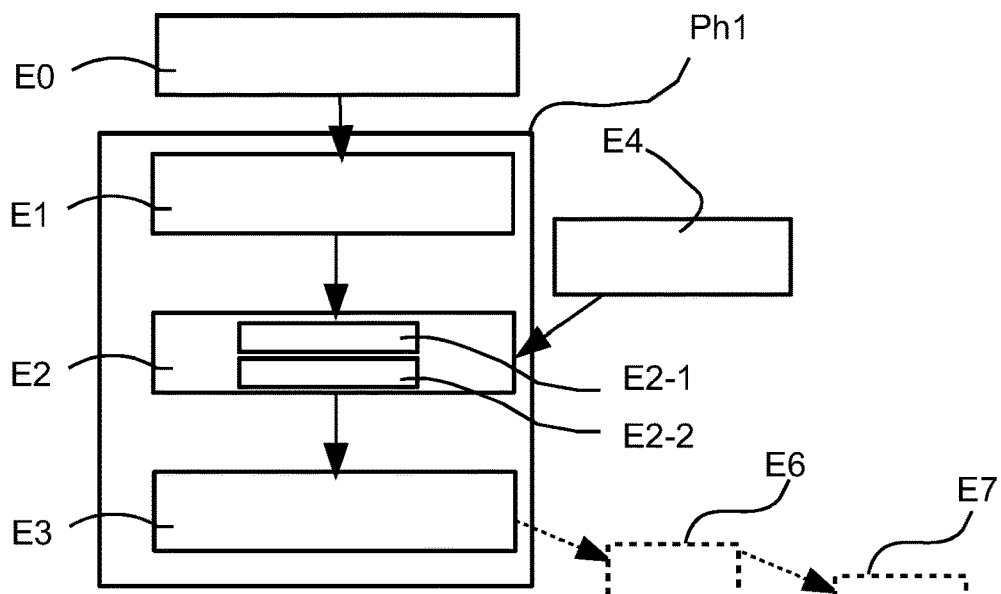
FIG. 4 illustrates steps of a use method making possible the thermoforming of the device.

It is understood from all which has been said above that the invention also relates to a method for use, also known as method for treatment, of a device intended to be thermoformed as described, notably at the end of which a thermoformed device is obtained. In fact, the use or treatment method makes it possible to start from the device intended to be thermoformed so as to make use of it in order to thermoform it. The use method comprises, as illustrated in FIG. 4, a thermoforming phase Ph1 comprising: a step E1 of heating the said device so as to allow a shaping of the substrate 3 of the device (the heating step E1 then makes it possible to bring the device, and notably the substrate 3, to its thermoforming temperature), and preferably causing the change of the electrically conductive material 5 from a solid state to a liquid state; a step E2 of shaping the substrate of the device, which is notably heated, according to a predetermined shape; during this shaping step E2, the said electrically conductive member 2 remains bonded to the substrate 3: the said electrically conductive member 2 is deformed with the said substrate 3; a step E3 of cooling the device, carried out after the shaping step E2, at the end of which there is formed a thermoformed device (FIG. 5) comprising the substrate 3 adopting the predetermined shape. In the context of the thermoformed device, the substrate 3 is in the solid state. Thus, the heating step E1 makes it possible to soften, that is to say to render ductile, the substrate 3, the shaping step E2 makes it possible to give the predetermined shape to the softened (that is to say, rendered ductile) substrate and the cooling step E3 makes it possible for the substrate to harden, with the result that it retains the predetermined shape.

During the step E2 of shaping the substrate 3, the electrically conductive material 5 is preferably in the liquid state. The result of this is that the electrically conductive material can flow during the shaping step E2 for the purpose of connecting electrically conductive particles 4 to elements of elongated shape 6 when the electrically conductive material 5 changes back to the solid state. Furthermore, when the electrically conductive material 5 flows, the elements of elongated shape 6 can become oriented and the electrically conductive particles 4 can be displaced. It is understood that the heating temperature applied to the device during the heating step E1 (also known as thermoforming temperature) can be greater than or equal to the melting point of the electrically conductive material 5 but strictly less than the melting points of the elements of elongated shape 6 and of the electrically conductive particles 4. A predetermined shape corresponds to a desired shape.

Preferably, the cooling step E3 makes possible, or causes, the change of the electrically conductive material from the liquid state to the solid state when the material has melted as a result of the heating step E1. Preferably, the thermoformed device (FIG. 5), notably at the end of the cooling step E3 and in the alternative form where the electrically conductive material melts during the step E1, comprises the electrically conductive member 2 integral with the substrate 3, the said electrically conductive member 2 being such that at least one of the electrically conductive particles 4 is connected to at least one of the elements of elongated shape 6 by a bonding element 7 comprising at least a portion of the electrically conductive material 5. In particular, each element of elongated shape 6 can be connected to several electrically conductive particles by a bonding element 7.

It is understood from what has been said above that the heating step E1 may or may not make possible the melting of the electrically conductive material 5, or also a partial melting not sufficient for the desired aim of reconnection of electrically conductive particles 4 with elements of elongated shape 6.

In the present description, when reference is made to the melting of the electrically conductive material, this is understood to mean that the latter changes completely, or at least predominantly, from its solid state to its liquid state.

In the case where the heating step E1 makes it possible to carry out the melting of the electrically conductive material 5, the latter will make it possible to connect, during the cooling thereof, particles 4 with elements of elongated shape 6 for the purpose of forming an assembly which makes it possible to obtain the desired conductivity of the electrically conductive member 2.

According to an embodiment, the method can comprise, after the cooling step E3 (notably after the thermoforming phase PH1), a step E6 (represented in dotted lines in FIG. 4) of additional heating of the device, then forming the thermoformed device, to a temperature which makes it possible to melt the electrically conductive material 5, notably while remaining below the melting points of the particles 4 and of the elements of elongated shape 6, and also preferably below the thermoforming temperature in order to avoid deforming again the substrate 3. After an additional cooling step E7 (represented in dotted lines in FIG. 4), carried out after the additional heating step E6, making it possible to change the electrically conductive material from the liquid state to the solid state and at the end of which the electrically conductive member 2 is integral with the substrate 3, the said electrically conductive member 2 is preferably as described at the end of the cooling step E3 when the heating step E1 makes possible the melting of the electrically conductive material. This embodiment can be employed in the case where the heating step E1 does not make possible the melting, or only makes possible an insufficient partial melting, of the electrically conductive material. During the step E6, the shape of the substrate is not modified. In fact, the step of heating the thermoforming phase can be so rapid that the electrically conductive material cannot melt or cannot correctly melt, and it is in this case that the additional heating step and the additional cooling step are applied.

Figure 5:
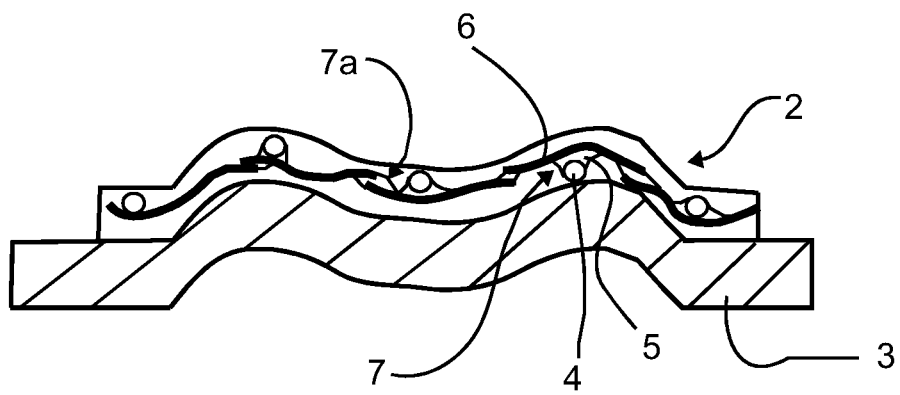
FIG. 5 illustrates a thermoformed device.

At the end of the cooling step E3, or of the additional cooling step E7, the electrically conductive member 2 can be such that it comprises an assembly of electrically conductive particles 4 and of elements of elongated shape 6 rendered integral by electrically conductive material 5 (FIG. 5). In fact, the electrically conductive material forms at least one soldering joint which assembles/fixes the particles and the elements of elongated shape of the assembly (FIG. 5). According to another formulation, at the end of the cooling step E3, or of the additional cooling step E7, the electrically conductive member 2 comprises at least one electrically conductive path comprising at least several of the electrically conductive particles 4 and at least several of the elements of elongated shape 6. At least a part of the electrically conductive material 5 then provides the mechanical and notably electrical connection between the electrically conductive particles 4 of the path and the elements of elongated shape 6 of the path. It is understood that the electrically conductive material 5 has undergone a melting which allows it to provide the desired electrical and mechanical connection between the electrically conductive particles 4 of the path and the elements of elongated shape 6 of the path. Notably, the electrically conductive particles 4 of the said path are each connected to at least one of the elements of elongated shape 6 of the path by a portion of the electrically conductive material, that is to say by a corresponding bonding element 7 comprising at least a portion of the electrically conductive material 5. Furthermore, each element of elongated shape 6 of the said path can be connected to at least one other of the elements of elongated shape 6 of the said path by a corresponding portion of the electrically conductive material, that is to say by a corresponding bonding member 7a (FIG. 5) comprising at least a portion of the electrically conductive material 5. The bonding members and the bonding elements can be formed within a continuity of matter made of electrically conductive material. The overall electrical conductivity of the electrically conductive member 2 is given by the electrically conductive path or a plurality of electrically conductive paths electrically connected together. Ideally, each electrically conductive particle 4 of the electrically conductive member 2 belongs to an electrically conductive path, and is connected to at least one of the elements of elongated shape 6 by a bonding element 7 as described. Ideally, each electrically conductive particle 4 is electrically connected to each of the other electrically conductive particles 4. Notably, the electrically conductive member extends between two ends (for example longitudinal ends), and the electrically conductive path or paths make it possible to provide an electrical conductivity between these two ends. In the present section, that which has been said in connection with the path can apply to the assembly. Although that which has been said in the present section is given in connection with the use method, this can also apply in the context of the thermoformed device taken in isolation or in the context of the device intended to be thermoformed taken in isolation, notably as long as the electrically conductive material has been subjected to melting beforehand.

It is understood from what has been said above that, generally, the use method can comprise a step of melting the electrically conductive material 5, it being possible for this melting step to be carried out by the heating step E1 or the additional heating step E6. Following the melting step, a step of solidification (for example carried out by the cooling step or the additional cooling step) of the electrically conductive material makes it possible to form the electrically conductive member as described in the preceding section, and comprising notably the assembly described.

A bonding element 7 within the meaning of the present description can make it possible to mechanically and electrically connect at least one particle 4 to at least one element of elongated shape 6: there is contact between the bonding element 7 and the particle 4 and between the bonding element 7 and the element of elongated shape 6. A bonding member 7a within the meaning of the present description can make it possible to mechanically and electrically connect together elements of elongated shape 6: there is contact between the elements of elongated shape and the bonding member. Furthermore, at the end of the cooling step (additional or not) or in the context of the thermoformed device, the electrically conductive member 2 can be such that the same element of elongated shape can be connected to several electrically conductive particles by corresponding bonding elements.

The use method can comprise (FIG. 4) a step E0 of providing the device intended to be thermoformed as described upstream of the heating step E1, that is to say before the thermoforming phase.

During the thermoforming phase Ph1, notably during the heating step E1 and the shaping step E2, the electrically conductive element 2 remains integral with the substrate 3. In this sense, the thermoforming phase also makes it possible to modify the shape of the electrically conductive member 2. The deformation of the electrically conductive member 2 is preferably accompanied by the melting of the electrically conductive material 5 which will, after cooling, electrically connect particles of the electrically conductive member 2 with elements of elongated shape 6 of the electrically conductive member 2.

As illustrated in FIG. 5, the invention also relates to a thermoformed device comprising the substrate 3, the shape of which was obtained by thermoforming, and the electrically conductive member 2 integral with the substrate 3. The electrically conductive member 2 comprises the electrically conductive particles 4, the electrically conductive material 5 (notably which has undergone melting) and the electrically conductive elements of elongated shape 6. Preferably, the electrically conductive member 2 is such that at least one of the electrically conductive particles 4 is connected to at least one of the elements of elongated shape 6 by a bonding element 7 comprising at least a portion of the electrically conductive material 5 in particular obtained by melting, then solidification of the electrically conductive material 5. In particular, the electrically conductive member 2 can be such that it comprises the assembly described above or at least an electrically conductive path as described above. For example, a least a part of the particles 4 are united with elements of elongated shape 6 by melting the electrically conductive material 5. According to another formulation, the electrically conductive member 2 can comprise at least one bonding element 7 (notably bonding elements) comprising at least a portion of the electrically conductive material 5; in particular, this portion was obtained by melting and then by solidifying the electrically conductive material 5, each bonding element 7 connecting at least one of the electrically conductive particles 4 to at least one of the elements of elongated shape 6. Of course, the electrically conductive material 5 has a melting point which is strictly less than the melting point of the electrically conductive particles 4 and than the melting point of the elements of elongated shape 6. Furthermore, the electrically conductive member 2 can also comprise bonding members 7a comprising at least a portion of the electrically conductive material 5 and each connecting at least one of the elements of elongated shape 6 to at least one other of the elements of elongated shape.

Generally, applicable to the use method, to the device intended to be thermoformed and to the thermoformed device, the bonding elements 7 and if appropriate the bonding members 7a were obtained by melting the electrically conductive material 5 and then by solidifying the latter. The bonding elements and members can each form a soldering joint or a soldered joint. A bond obtained by melting and then by solidifying the electrically conductive material 5 can easily be identified; this is because it is comparable to a soldering joint in the sense that the electrically conductive material present within the bond makes it possible to form an intermetallic bond between at least one of the electrically conductive particles 4 and at least one of the elements of elongated shape 6. In fact, the molten electrically conductive material 5 penetrates by capillary action or by diffusion into pores located at the surface of the element of elongated shape 6 and of the electrically conductive particle 4. The same principle applies for the bonding member 7a which connects together elements of elongated shape. It is understood that the assembly described above is notably such that the particles and the elements of elongated shape are soldered together by electrically conductive material 5.

It is understood that the electrically conductive material 5 makes it possible, for example, to form welds, each weld connecting at least one electrically conductive particle to at least one element of elongated shape. In the present description, the term "weld" is understood to mean the definition within the broad sense of this term, namely the formation of a bond between two pieces (this bond making it possible notably to provide mechanical maintenance and electrical continuity between the two pieces) without prejudging the technique used to obtain this bond. Preferably, the term weld is interpreted as being a soldered joint which corresponds to the formation of a bond obtained by melting a filler material formed by the electrically conductive material 5 without the original contours of the electrically conductive particles 4 and of the elements of elongated shape 6 being modified by the soldering.

In other words, during the step E1 of heating or the step E6 of additional heating (and notably throughout the use method) of the device (or more generally during the step of melting the electrically conductive material 5 described above), the electrically conductive particles 4 and the elements of elongated shape 6 retain their original contours. This is understood to mean that the elements of elongated shape and the electrically conductive particles 4 remain in the solid state. Thus, the heating step E1 or the additional heating step E6 or, if appropriate, the step of melting the electrically conductive material 5 is such that the electrically conductive particles 4 remain below their melting point and that the elements of elongated shape 6 remain below their melting point.

Figure 6:
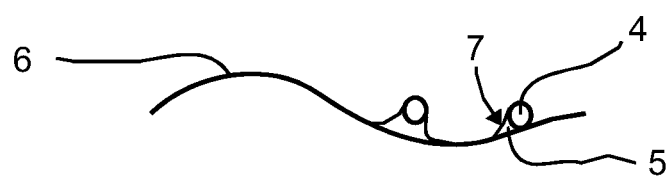
FIG. 6 illustrates a bonding element bonding a particle to an element of elongated shape.

According to an embodiment of the device intended to be thermoformed, the electrically conductive member comprises at least one bonding element 7 (FIG. 6) comprising at least a portion of the electrically conductive material 5, notably obtained by melting and then solidifying the electrically conductive material 5. Each bonding element 7 connects at least one of the electrically conductive particles 4 to at least one of the elements of elongated shape 6. The melting of the electrically conductive material 5 was, for example, obtained during the evaporation, carried out by heat treatment, of a solvent of an ink used to form the electrically conductive member on the substrate 3. In particular, according to this embodiment, the electrically conductive member can comprise an assembly or at least an electrically conductive path as described above. This embodiment exhibits the advantage of having solderings before the thermoforming, which may be preferred when the mechanical stresses and the shapes to be taken of the mould during the thermoforming are very restricting.

Figure 7:
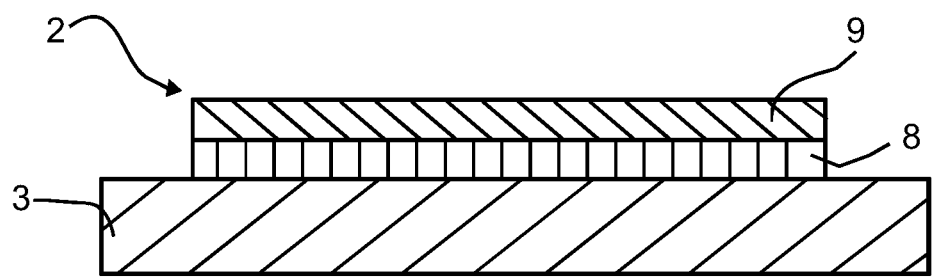
FIGS. 7 to 10 illustrate views in section of the type of the section A-A of FIG. 1 for different embodiments of devices intended to be thermoformed.

FIG. 7 illustrates a specific embodiment of the device intended to be thermoformed for which the electrically conductive member 2 comprises a stack of layers comprising a first layer 8 and a second layer 9 arranged on the first layer 8. The first layer 8 is interposed between the substrate 3 and the second layer 9. Notably, the first layer 8 is arranged on, that is to say assembled with, the substrate 3. The first layer 8 comprises a part of the elements of elongated shape. In particular, the first layer 8 is a layer of elements of elongated shape, which can optionally comprise a binder. The second layer 9 comprises another part (or the remainder) of the elements of elongated shape, the electrically conductive particles and the electrically conductive material. In particular, the second layer 9 is a layer of electrically conductive particles within which the electrically conductive material and the elements of elongated shape are dispersed: this second layer 9 thus predominantly comprises particles. This embodiment is preferred as, during the thermoforming, the first layer 8 makes it possible to form a guide rail over which the electrically conductive particles, the electrically conductive material (this electrically conductive material being in the liquid or solid state during the thermoforming: if the state of the electrically conductive material is solid, the electrically conductive member is such that electrically conductive particles are free to move or to be displaced under mechanical stresses) and the elements of elongated shape 6 of the second layer 9 slide. This embodiment is the most advantageous as the presence of an intermediate layer of elements of elongated shape between the substrate and the remainder of the stack makes it possible to limit the loss of conductivity of the electrically conductive member up to elongations of 60% of the substrate and even under thermal stress at very high temperature. This option has made it possible to overcome both mechanical and thermal difficulties during deformations and annealings. Furthermore, this embodiment gives a system which is the most stable: there is virtually no appearance of cracks during temperature stretching and the structure is stretched without excessively deforming, as though it were opened out internally. During the thermoforming, the first and second layers 8, 9 may partially mix in the event of melting of the electrically conductive material or partially mix through the interstices of the layers. For example, the electrically conductive material may migrate so as to bond, notably by soldering for which the electrically conductive material forms a filler material, elements of elongated shape together (whether they originate from the first layer 8 or from the second layer 9) and with corresponding electrically conductive particles. The first layer 8 can have a thickness comprised between 100 nm and 2 µm; the elements of elongated shape present in the first layer 8 can represent between 35% and 85% of the volume of the first layer 8. The second layer 9 can have a thickness comprised between 5 µm and 25 µm; the elements of elongated shape present in the second layer 9 can represent between 5% and 35% of the volume of the second layer 9. The electrically conductive particles in the second layer can represent between 55% and 80% of the volume of the second layer and the electrically conductive material can represent between 10% and 30% of the volume of the second layer 9. In particular, the thickness of the different layers can vary as a function of the overall electrical conductivity desired for the electrically conductive member, the aim generally being to obtain an electrical conductivity of greater than $10^6$ S/m for the electrically conductive member in its entirety.

According to an alternative form of the embodiment of FIG. 7, the electrically conductive member 2 comprises a stack of layers comprising a first layer 8 and a second layer 9 arranged on the first layer 8. The first layer is interposed between the substrate 3 and the second layer 9. The first layer 8 comprises the elements of elongated shape and the second layer 9 comprises the electrically conductive particles and preferably the electrically conductive material. Preferably, according to this alternative form, the first layer 8 comprising the elements of elongated shape connects the substrate 3 to the second layer 9 comprising the electrically conductive particles. In this instance, the electrically conductive material can be present in the second layer 9 comprising the electrically conductive particles and/or in the first layer 8 comprising the elements of elongated shape. According to this alternative form, the thickness of the second layer 9 can be comprised between 5 µm and 25 µm, preferably equal to 15 µm. Notably, the electrically conductive particles can represent between 55% and 85% of the volume of the second layer 9 and, if appropriate, the electrically conductive material present in the second layer can represent between 10% and 30% of the volume of the second layer 9. The first layer 8 comprising the elements of elongated shape can have a thickness comprised between 50 nm and 2 µm; notably, the elements of elongated shape can represent more than 65%, preferably more than 80%, of the volume of the first layer 8. In this instance, during the thermoforming, the constituents of the first and second layers 8, 9 can mix with or without melting of the electrically conductive material. In the case where there is mixing without melting of the electrically conductive material, the electrically conductive particles are preferably separate, and they can move, for example under mechanical stress, and thus be displaced (in this case, if there are elements of elongated shape, there may be a contact point between a particle which is being displaced and an element of elongated shape) at the interface between the layers 8 and 9, for example in order to form at least one electrically conductive path as described above.

Figure 8:
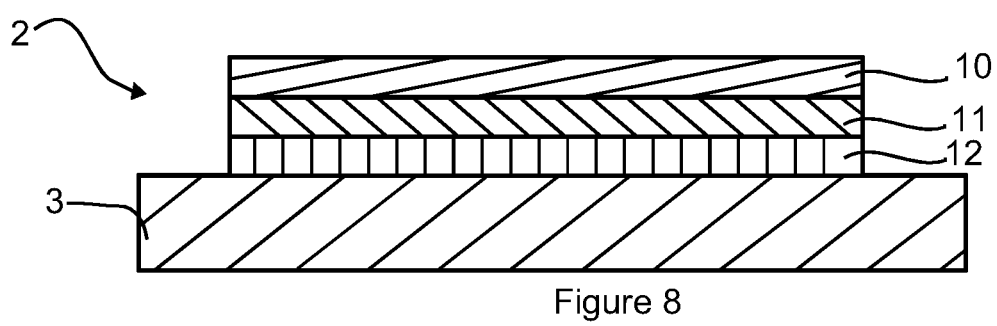

According to another embodiment of the device intended to be thermoformed illustrated in FIG. 8, the electrically conductive member 2 comprises a stack of layers comprising a layer 10 comprising the electrically conductive particles (notably a layer 10 of electrically conductive particles), a layer 11 comprising the electrically conductive material (notably a layer 11 made of electrically conductive material) and a layer 12 comprising the elements of elongated shape (notably a layer 12 of elements of elongated shape). Preferably, the layer 11 comprising the electrically conductive material is interposed between the layer 10 comprising the particles and the layer 12 comprising the elements of elongated shape: this makes it possible to facilitate, in particular during the melting of the electrically conductive material, notably during the thermoforming phase or subsequently, the creation of bonding elements, forming notably soldering joints, each connecting at least one of the particles with at least one of the elements of elongated shape. The layer 11 comprising the electrically conductive material is notably in contact with the layer 10 comprising the particles and the layer 12 comprising the elements of elongated shape. Notably, the layer 12 comprising the elements of elongated shape is interposed between the substrate 3 and the layer 11 comprising the electrically conductive material (this layer 12 is notably in contact with the substrate 3): the fact of positioning the elements of elongated shape at the interface with the substrate 3 makes it possible to improve the behaviour when stretching the electrically conductive member 2 since the electrically conductive particles will slide and be distributed more easily in the electrically conductive member 2 when the electrically conductive material is in the liquid or solid state. If appropriate, if the electrically conductive material does not melt during the thermoforming, free and separate electrically conductive particles may, for example, change in point of contact with an element of elongated shape and finally still be in electrical contact with the latter after a displacement brought about by a thermal or mechanical stress, for example applied to the substrate. In addition, the layer 12 comprising the elements of elongated shape is that which exhibits the best behaviour when stretching as a result of the presence of the elements of elongated shape, which will become oriented according to the stretching of the substrate during the thermoforming. The layer 12 comprising the elements of elongated shape can have a maximum thickness of 2 µm and notably comprised between 100 nm and 500 nm, and the elements of elongated shape can represent between 35% and 85% by volume of the layer 12. The layer 11 can have a thickness of between 100 nm and 2 µm, and the electrically conductive material can represent between 35% and 85% by volume of the layer 11. The layer 10 can have a thickness of between 2 µm and 20 µm, and the electrically conductive particles can represent between 65% and 85% by volume of the layer 10. In this instance, the constituents of the three layers 10, 11, 12 will be able to mix, at least partially, notably during the thermoforming, with or without melting of the electrically conductive material, for example by diffusion of the electrically conductive material and migration of the electrically conductive particles in the direction of the elements of elongated shape.

Figure 9:
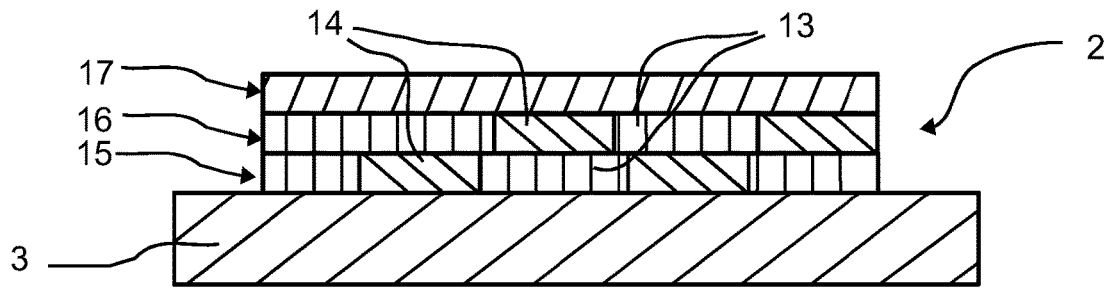

According to yet another embodiment of the device intended to be thermoformed illustrated in FIG. 9, the electrically conductive member 2 comprises first parts 13 each comprising a corresponding part of the electrically conductive particles, and second parts 14 each comprising a corresponding part of the elements of elongated shape. In particular, the electrically conductive material is present in the first parts 13 and/or in the second parts 14. Preferably, in this instance, the electrically conductive member 2 comprises a stack of layers comprising a first layer 15, notably arranged on the substrate 3, provided with at least one of the first parts 13 and with at least one of the second parts 14, a second layer 16 arranged on the first layer 15 and provided with at least one of the first parts 13 and with at least one of the second parts 14. In this instance, each second part 14 is at a distance from the other second parts 14: there is thus no contact between the second parts 14, so as to promote mixing between the parts 13 and 14 during the melting of the electrically conductive material, but the second parts 14 are each in contact with at least one first part 13. In other words, this embodiment makes it possible to form islets each comprising a corresponding part of the elements of elongated shape, these islets being connected together by matter comprising the electrically conductive particles and possibly electrically conductive material. This case makes it possible to have locally, in the electrically conductive member, zones/parts having strong deformations capable of storing the majority of the strains during the thermoforming (with or without melting of the electrically conductive material during the thermoforming; if there is no melting of the electrically conductive material, then the member can be such that particles 4 are capable of moving during the thermoforming) and to obtain, in the end, an electrically conductive member: it is then understood that the second parts will preferably be judiciously arranged, taking into account the future stretching of the substrate 3 and thus of the electrically conductive member 2 during the thermoforming. In other words, the position, the dimensions and the composition of the first and second parts 13, 14 can be adjusted according to the shape which it is desired to give to the thermoformable device. This is because the presence of elements of elongated shape having a greater length than the maximum dimensions of the electrically conductive particles will make it possible for the parts comprising the elements of elongated shape to have a better behaviour when stretching. Furthermore, it is possible for the parts comprising the elements of elongated shape to have different dimensions and/or densities of elements of elongated shape which are different in order to take into account the future local stretching of the substrate 3 and thus of the electrically conductive member 2 during the thermoforming. In particular, the stack also comprises a third layer 17 arranged on the second layer 16 of the stack, this third layer comprising electrically conductive particles distributed throughout the third layer, and preferably electrically conductive material. In this instance, the height of the stack can, for example, be 20 µm, and it can have a width comprised between 50 µm and 2 mm. The first layer 15 can have a thickness comprised between 100 nm and 2 µm, the second layer 16 can have a thickness comprised between 2 µm and 5 µm and the third layer 17 can have a thickness comprised between 8 µm and 18 µm. The elements of elongated shape can represent between 35% and 85% by volume of each of the second parts. Furthermore, if appropriate, the electrically conductive material present in the second parts can represent between 10% and 55% of the volume of each of the second parts. The electrically conductive particles can represent between 35% and 85% by volume of each of the first parts. Furthermore, if appropriate, the electrically conductive material present in the first parts can represent between 65% and 85% of the volume of each of the first parts or be appropriate to the volume of the electrically conductive particles of the first parts. The electrically conductive particles can represent between 65% and 85% by volume of the third layer 17; if appropriate, the electrically conductive material present in the third layer 17 represents between 15% and 35% of the volume of the third layer 17. During the thermoforming, notably with melting of the electrically conductive material, the different layers will interact and mix, at least partially, to form an assembly or at least an electrically conductive path such as are described above.

Generally, a percentage of the volume, for each layer or each part, can also comprise a binder, which will be described in more detail below. A person skilled in the art will know how to adapt the layers (or the first and second parts) in order to arrive at the expected result; for example, when, in the examples given, the things present in the volume of a layer do not reach the 100% of the volume of this layer, a person skilled in the art can form this layer so that it comprises additional electrically conductive particles, for example of the type of the electrically conductive particles 4 as described, in order to tend towards, or to reach, this volume of 100%. Furthermore, if necessary, a person skilled in the art can adapt the ranges given as percentage to reach, or tend towards, the volume of 100%. The electrically conductive member can also comprise, for a volume of 100% comprising the particles 4, the elements of elongated shape 6 and the electrically conductive material 5, 80% of particles 4, 10% of elements of elongated shape 6 and 10% of electrically conductive material 5.

Furthermore, it is understood from what has been said above that, when the electrically conductive material does not melt during the thermoforming (that is to say, during the thermoforming phase ph1), the electrically conductive member is notably such that electrically conductive particles 4 are capable of being displaced.

In a way applicable to all the embodiments, the thickness of the electrically conductive member 2 of the device intended to be thermoformed along a direction normal to the substrate can depend on the thickness thereof desired after thermoforming of the device, while knowing the characteristics of stretching of the substrate 3 and thus of the electrically conductive member during the thermoforming.

In the context of an electrically conductive member 2 forming an electrically conductive track, the width of the track before thermoforming is preferably comprised between 50 µm and 2 mm, and the height of the track can be comprised between 1 µm and 35 µm, and notably equal to 20 µm. The length of the track will be appropriate to what it is desired to produce. After thermoforming, the width of the track is preferably comprised between 50 µm and 5 mm, and the height of the track can be comprised between 5 µm and 25 µm, and notably equal to 15 µm. The dimensions given in this instance after thermoforming can take into account a widening or a shrinking of the electrically conductive member as a result of the shaping of the substrate which carries it.

Preferably, within the electrically conductive member 2 (FIGS. 2 and 5), the electrically conductive particles 4, the elements of elongated shape 6 and then the electrically conductive material 5 are encountered as percentage by weight, and in decreasing fashion of this percentage by weight. Typically, a minimum of 60% by weight, and more particularly 80% by weight, or according to a range between 65% and 85% by weight, of the electrically conductive member 2 corresponds to the weight of the electrically conductive particles 4. The remaining percentage by weight of the electrically conductive member corresponds to the weight of the elements of elongated shape 6, of the electrically conductive material 5 and of a possible binder used to form an ink to be deposited for the purpose of producing the electrically conductive member. More particularly, for the remaining percentage by weight, the elements of elongated shape 6 represent, by weight, twice the weight of the electrically conductive material 5, and the binder, when it is present, represents, by weight, half the weight of the electrically conductive material 5. A person skilled in the art is in a position to adapt the proportions of the constituents of the electrically conductive member depending on the result desired after thermoforming.

Figure 10:
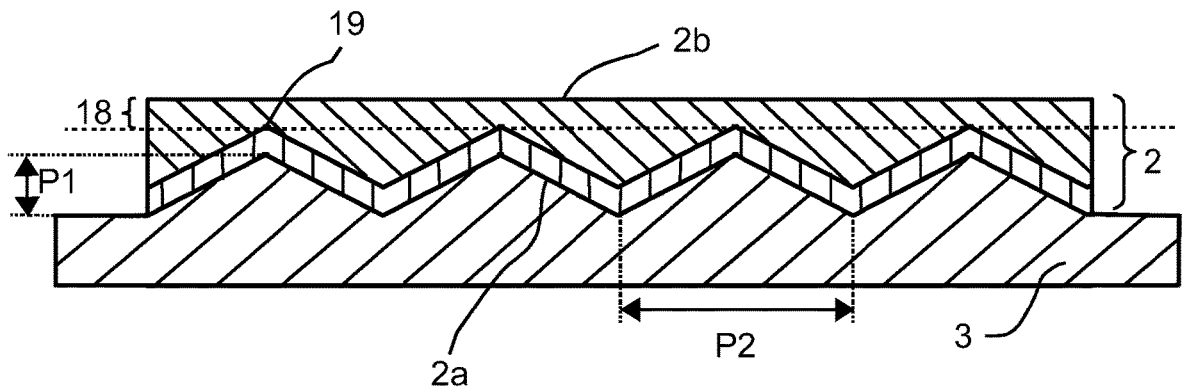

In a general way applicable to all the embodiments of the device intended to be thermoformed, the substrate 3 can have, at its interface with the electrically conductive member 2, a hollowed structure (FIG. 10). In this case, the electrically conductive member 2 extends from the hollowed structure and comprises a section 18 extending from the summits 19 of the hollows and having a thickness comprised between 100 nm and 20 µm. The presence of this section 18 makes it possible to provide continuity of the electrically conductive member 2 before and after thermoforming of the device. According to another formulation, it is said that the electrically conductive member 2 of the device intended to be thermoformed comprises a first face 2a in contact with the substrate 3 and a second face 2b opposite the first face 2a; the surface of the first face 2a is strictly greater than the surface of the second face 2b. The presence of the hollows is advantageous in the sense that, during the thermoforming, the substrate 3 will be subjected to stresses in stretching, which are overall greater than those of the electrically conductive member: the result of this is that the stretching of the electrically conductive member is limited, thus limiting the appearance of cracks in the latter. In particular, the hollows have a depth P1 comprised between 50 nm and 50 µm, and notably equal to 20 µm; furthermore, the repeat pitch P2 of the hollows is comprised between 100 µm and 2 mm. The pitch P2 between two hollows generally represents the shortest distance separating the centres of the bottoms of two adjacent hollows. FIG. 10 illustrates the embodiment of the hollowed substrate 3, combined with the mode of FIG. 7; of course, the hollowed substrate can be applied to all the other embodiments.

Figure 11:
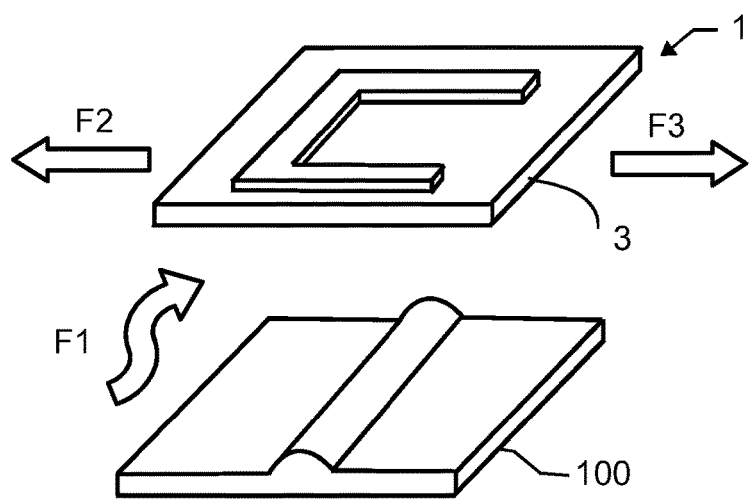
FIGS. 11 to 13 illustrate different steps of the use method making possible the thermoforming of the device.
Figure 12:
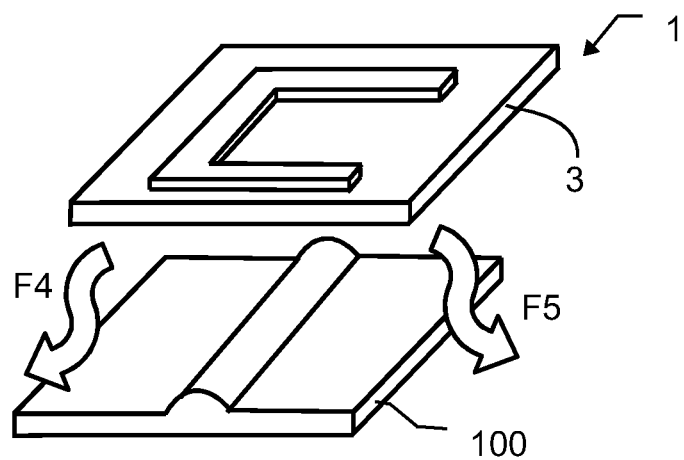
Figure 13:
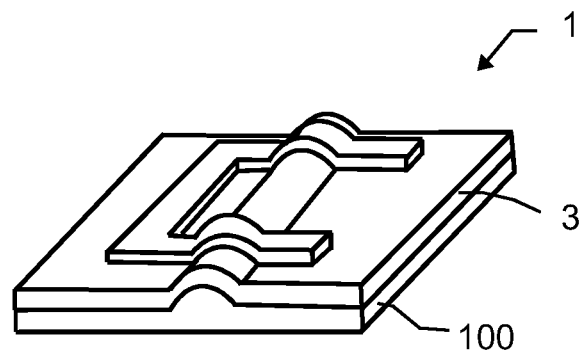

To return to the use method, the latter can comprise a step E4, as represented in FIG. 4, of providing an object 100 (FIG. 11) comprising the predetermined shape (for example a mould), that is to say which makes it possible to give the predetermined shape to the device, and the shaping step E2 successively comprises a step E2-1 of projecting a gaseous fluid (arrow F1) so as to stretch (arrows F2 and F3) the substrate 3 of the heated device, and a suction step E2-2 (arrows F4, F5 of FIG. 12) which make it possible to flatten the device 1 (notably the substrate 3 of the device 1) against the object 100 (FIG. 13) so that the said device 1 (notably the substrate 3) takes on the shape of at least a part of the surface of the said object 100.

Generally, the electrically conductive member 2, whether that either in the context of the device intended to be thermoformed, that is to say before the thermoforming thereof, or of the thermoformed device, can comprise cellulose or an elastomer made of rubber or of silicone forming the binder mentioned above. The cellulose or the elastomer can be provided in the form of fibres, known as nanofibres, and acted as binder to form the electrically conductive member when the latter was printed with an ink, the viscosity of which was adjusted by the said binder.

Figure 14:
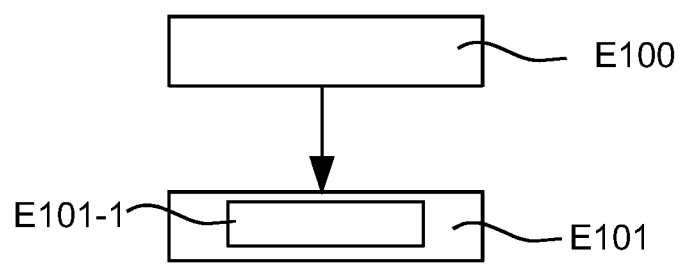
FIG. 14 illustrates a method for the manufacture of a device intended to be thermoformed.

The invention also relates to a method for the manufacture of a device intended to be thermoformed as described. The field of printed electronics is concerned in this instance. This manufacturing method comprises (FIG. 14):
- a step E100 of providing the substrate 3 (FIG. 1),
- a step E101 of formation of the electrically conductive member 2 implementing at least one step E101-1 of deposition of an ink on the substrate 3 (FIG. 1).

The step of deposition of the ink on the substrate can be carried out by screen printing, by inkjet, by photogravure or by coating. The deposition of an ink is also known as printing of the ink in the field. Furthermore, any other type of deposition can be employed as long as it makes it possible to obtain the desired result.

Generally, within the meaning of the present description, an ink comprises a solvent, if appropriate the electrically conductive particles and/or the elements of elongated shape and/or the electrically conductive material. The solvent makes it possible to wet and fluidify the ink in order to allow it to be deposited/printed. The solvent can be chosen from ethylene glycol, ethylene glycol monoether, isopropanol, cyclopentanone, ethanol, toluene, mesitylene and methyl acetate. The solvent has a very low vapour pressure at an ambient temperature of 35° C.; the vapour pressure is related to the tendency of the molecules to change from the liquid (or solid) state to the gas state. Ideally, the solvent is also notably chosen in order to be able to evaporate in a reasonable time, for example of the order of 5 min, at a predetermined temperature, for example of 150° C., in order to minimize the drying time on the substrate. As the case may be, it is understood that the evaporation of the solvent is liable to cause the electrically conductive material to melt but not the electrically conductive particles or the elements of elongated shape.

According to a specific example, which makes it possible notably to carry out the embodiment of FIG. 2, the manufacturing method can comprise a step of preparation of the ink so that it comprises the solvent, the electrically conductive particles, the electrically conductive material and the elements of elongated shape. The deposition step subsequently makes it possible to deposit a layer according to an appropriate pattern and then the solvent is evaporated, for example by the use of a heat treatment step after the deposition step.

According to another specific example, which makes it possible to carry out the embodiment of FIG. 7, the manufacturing method can comprise a step of preparation of a first ink and of a second ink, the first ink being deposited on the substrate and the second ink being deposited on the first ink after evaporation of the solvent from the first ink. In this instance, the first ink can comprise the solvent and everything which the layer 8 mentioned above comprises, and the second ink can comprise the solvent and everything which the layer 9 mentioned above comprises. After deposition of the second ink, the solvent of the second ink is evaporated.

According to another specific example, which makes it possible to carry out the embodiment of FIG. 8, the manufacturing method can comprise a step of preparation of a first ink, of a second ink and of a third ink, the first ink being deposited on the substrate and the second ink being deposited on the first ink after evaporation of the solvent from the first ink and the third ink being deposited on the second ink after evaporation of the solvent from the second ink, and then the solvent of the third ink is evaporated. In this instance, the first ink can comprise the solvent and everything which the layer 12 mentioned above comprises, the second ink can comprise the solvent and everything which the layer 11 mentioned above comprises, and the third ink can comprise the solvent and everything which the layer 10 mentioned above comprises.

As regards the embodiment of FIG. 9, the manufacturing method can comprise a step of preparation of a first ink and of a second ink, which inks will be deposited so as to obtain the desired result.

In a way applicable to each ink described above, the said ink can also comprise dispersing agents which oppose the agglomeration/the sedimentation of the constituent(s) thereof, such as, if appropriate, the electrically conductive particles and/or the electrically conductive material and/or the elements of elongated shape. Furthermore, as was touched on above, the ink can comprise a binder comprising cellulose and/or an elastomer made of rubber or of silicone. The role of this binder is to adjust the viscosity of the ink in order for the latter to be compatible with the printing technique used.

According to a specific embodiment which can be applied to everything which has been said above, the predetermined shape which it is desired to give to the device during the thermoforming is known in advance. In this sense, it is possible to know locally, with the electrically conducting member, the stress to which it will be subjected during the thermoforming and to consequently adjust its composition. In this sense, the electrically conductive member can comprise several parts or stretches, each comprising electrically conductive particles 4, an electrically conductive material 5, electrically conductive elements of elongated shape 6. For each part, the amount of electrically conductive particles 4 and/or of the electrically conductive material 5 and/or of the electrically conductive elements of elongated shape 6 can be adjusted depending on a stretching parameter known in advance. Furthermore, the dimension in length of the elements of elongated shape can be adjusted depending on the stretching anticipated for the substrate during the thermoforming.

It results from everything which has been said above that the device intended to be thermoformed is very particularly adapted in order to form electrically conductive members after thermoforming which have a conductivity appropriate to their application, as in the field of antennas.

Furthermore, the device described can be broadened to any deformable device, that is to say whose substrate is deformable, for example by mechanical stretching or by thermoforming. This is because the presence of elements of elongated shape in the electrically conductive member can make it possible to tolerate elongations brought about by stretching.

Thus, the device can undergo a deformation of its substrate along one or more directions. Furthermore, the electrically conductive member is such that it is also capable of absorbing strains without breaking as a result of its structure, even in applications where there is continuous or sporadic stretching. The ink or inks described above can also be used on substrates which will be intended to deform during their use. The composition of the electrically conductive member allows it to be subjected to stresses while ensuring the function thereof.

The present invention makes it possible to improve the electrical conductivity of a deformed electrically conductive member by virtue of the elements of elongated shape which can more easily extend between electrically conductive particles which are moving away as the result of a thermoforming or of a deformation, for the purpose of participating in their electrical connection subsequent to the melting of the electrically conductive material. The greater the stretching of the substrate, notably during the thermoforming, the more the electrically conductive member will be placed under stress and the greater will be the length of the elements of elongated shape, in order to make it possible to provide a good electrical conductivity after stretching.

The invention claimed is:

1. A method for processing of a device intended to be thermoformed comprising a substrate capable of being thermoformed and an electrically conductive member integral with the substrate, wherein the electrically conductive member comprises electrically conductive particles, an electrically conductive material, and electrically conductive elements of elongated shape, each of the elements of elongated shape having at least one of a folded-back, bent, or wound configuration, wherein the electrically conductive material has a melting point which is less than the melting point of the electrically conductive particles and less than the melting point of the elements of elongated shape, wherein the method comprising:
    a step (E1) of heating the device so as to allow a shaping of the substrate of the device,
    a step (E2) of shaping the substrate according to a predetermined shape, during which the electrically conductive member remains bonded to the substrate and during which the elements of elongated shape, each having the at least one of the folded-back, bent, or wound configuration, are stretched along their elongated dimension out of the at least one of the folded-back, bent, or wound configuration, and
    a cooling step (E3), at an end of which there is formed a thermoformed device comprising the substrate adopting the predetermined shape,
    wherein the electrically conductive member comprises a stack of layers, wherein at least one layer of the stack of layers comprises only one of (i) the elements of elongated shape or (ii) the electrically conductive particles.

2. The method according to claim 1, further comprising a step (E4) of providing an object comprising the predetermined shape, the shaping step (E2) successively comprising:
    a step (E2-1) of projecting a gaseous fluid so as to stretch the substrate of the heated device,
    a suction step (E2-2) which makes it possible to flatten the device against the object so that the device takes on a shape of at least a part of a surface of the object.

3. The method according to claim 1, further comprising a step (E6) of additional heating of the device, carried out after the cooling step (E3), to a temperature which makes it possible to melt the electrically conductive material.

4. The method according to claim 1, wherein the heating step (E1) causes a change of the electrically conductive material from a solid state to a liquid state.

5. The method according to claim 4, wherein, at the end of the cooling step (E3), the electrically conductive member comprises an assembly of the electrically conductive particles and of the elements of elongated shape rendered integral by the electrically conductive material.

6. The method according to claim 1, wherein the elements of elongated shape have a length of greater than or equal to 20 µm.

7. The method according to claim 1, wherein the electrically conductive member comprises at least one bonding element comprising at least a portion of the electrically conductive material, the portion is obtained by melting and then solidifying the electrically conductive material, each bonding element connecting at least one of the electrically conductive particles to at least one of the elements of elongated shape.

8. The method according to claim 1, wherein the stack of layers comprises a first layer and a second layer arranged on the first layer, the first layer being interposed between the substrate and the second layer, the first layer comprising at least one of the elements of elongated shape and the second layer comprising at least another one of the elements of elongated shape, the electrically conductive particles, and the electrically conductive material.

9. The method according to claim 1, wherein the stack of layers comprises a first layer and a second layer arranged on the first layer, the first layer being interposed between the substrate and the second layer, the first layer comprising the elements of elongated shape and the second layer comprising the electrically conductive particles and the electrically conductive material.

10. The method according to claim 1, wherein the stack of layers comprises a first layer comprising the electrically conductive particles, a second layer comprising the electrically conductive material, and a third layer comprising the elements of elongated shape.

11. The method according to claim 1, wherein the electrically conductive member comprises first parts each comprising at least one of the electrically conductive particles and second parts each comprising at least one of the elements of elongated shape, the electrically conductive material being present in the first parts and/or in the second parts, wherein the stack of layers comprises:
    a first layer provided with at least one of the first parts and with at least one of the second parts,
    a second layer arranged on the first layer and provided with at least one of the first parts and with at least one of the second parts,
    each second part being at a distance from other second parts.

12. The method according to claim 1, wherein the substrate has, at its interface with the electrically conductive member, a hollowed structure.

13. The method according to claim 1, wherein
    the elements of elongated shape are formed by nanowires and/or nanotubes and/or graphene sheets, and/or elements of elongated shape comprising a polymer core covered, in all or part, with an electrically conductive layer.

14. The method according to claim 1, wherein the elements of elongated shape have a length greater than a size of the electrically conductive particles.

\* \* \* \* \*